United States Patent
Hong et al.

(10) Patent No.: US 10,685,885 B2
(45) Date of Patent: Jun. 16, 2020

(54) SEMICONDUCTOR DEVICE

(71) Applicant: TAIWAN SEMICONDUCTOR MANUFACTURING CO., LTD., Hsinchu (TW)

(72) Inventors: Long-Jie Hong, Hsinchu (TW); Chih-Lin Wang, Hsinchu County (TW); Kang-Min Kuo, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/943,671

(22) Filed: Apr. 2, 2018

(65) Prior Publication Data

US 2018/0226297 A1    Aug. 9, 2018

Related U.S. Application Data

(63) Continuation of application No. 14/248,755, filed on Apr. 9, 2014, now Pat. No. 9,935,013.

(51) Int. Cl.
| | |
|---|---|
| *H01L 21/8234* | (2006.01) |
| *H01L 27/088* | (2006.01) |
| *H01L 29/66* | (2006.01) |
| *H01L 29/06* | (2006.01) |
| *H01L 29/51* | (2006.01) |
| *H01L 29/49* | (2006.01) |

(52) U.S. Cl.
CPC ......... *H01L 21/823456* (2013.01); *H01L 21/823412* (2013.01); *H01L 27/088* (2013.01); *H01L 29/0607* (2013.01); *H01L 29/66545* (2013.01); *H01L 29/66621* (2013.01); *H01L 29/49* (2013.01); *H01L 29/517* (2013.01)

(58) Field of Classification Search
CPC ..... H01L 21/823456; H01L 21/823412; H01L 27/088; H01L 29/0607; H01L 29/66545; H01L 29/66621; H01L 29/49; H01L 29/517
See application file for complete search history.

(56) References Cited

U.S. PATENT DOCUMENTS

| | | | |
|---|---|---|---|
| 5,178,813 | A | 1/1993 | Akatsu |
| 6,566,734 | B2 | 5/2003 | Sugihara |
| 8,497,212 | B2 | 7/2013 | Babich |
| 8,518,813 | B2 | 8/2013 | Yamakawa |
| 8,691,650 | B2 | 4/2014 | Cheng |
| 8,815,702 | B2 | 8/2014 | Oh |
| 9,196,710 | B2 | 11/2015 | Wei |
| 2005/0051834 | A1* | 3/2005 | Kitamura ............. H01L 27/115 257/315 |

(Continued)

*Primary Examiner* — Zandra V Smith
*Assistant Examiner* — Andre C Stevenson
(74) *Attorney, Agent, or Firm* — Maschoff Brennan

(57) ABSTRACT

A semiconductor device includes a substrate, an isolation structure, and a gate structure. The substrate has an active area. The isolation structure surrounds the active area of the substrate. The gate structure is across the active area of the substrate. The isolation structure has a first portion under the gate structure and a second portion adjacent to the gate structure. A top surface of the first portion of the isolation structure is lower than a top surface of the second portion of the isolation structure.

20 Claims, 10 Drawing Sheets

(56) References Cited

U.S. PATENT DOCUMENTS

| | | | | |
|---|---|---|---|---|
| 2008/0191292 A1* | 8/2008 | Callegari | .......... | H01L 21/28088 |
| | | | | 257/411 |
| 2009/0047766 A1* | 2/2009 | Lin | .................. | H01L 27/10876 |
| | | | | 438/282 |
| 2009/0267126 A1* | 10/2009 | Wang | .............. | H01L 21/823437 |
| | | | | 257/302 |
| 2009/0297126 A1* | 12/2009 | Cortes | ................ | H04N 7/17336 |
| | | | | 386/241 |
| 2010/0255649 A1* | 10/2010 | Lee | .................. | H01L 21/02057 |
| | | | | 438/270 |
| 2011/0189845 A1* | 8/2011 | Yamakawa | ..... | H01L 21/823807 |
| | | | | 438/589 |
| 2013/0252393 A1* | 9/2013 | Cheon | ................. | H01L 29/6656 |
| | | | | 438/303 |
| 2014/0011302 A1* | 1/2014 | Ruelke | ............... | H01L 21/3185 |
| | | | | 438/5 |

\* cited by examiner

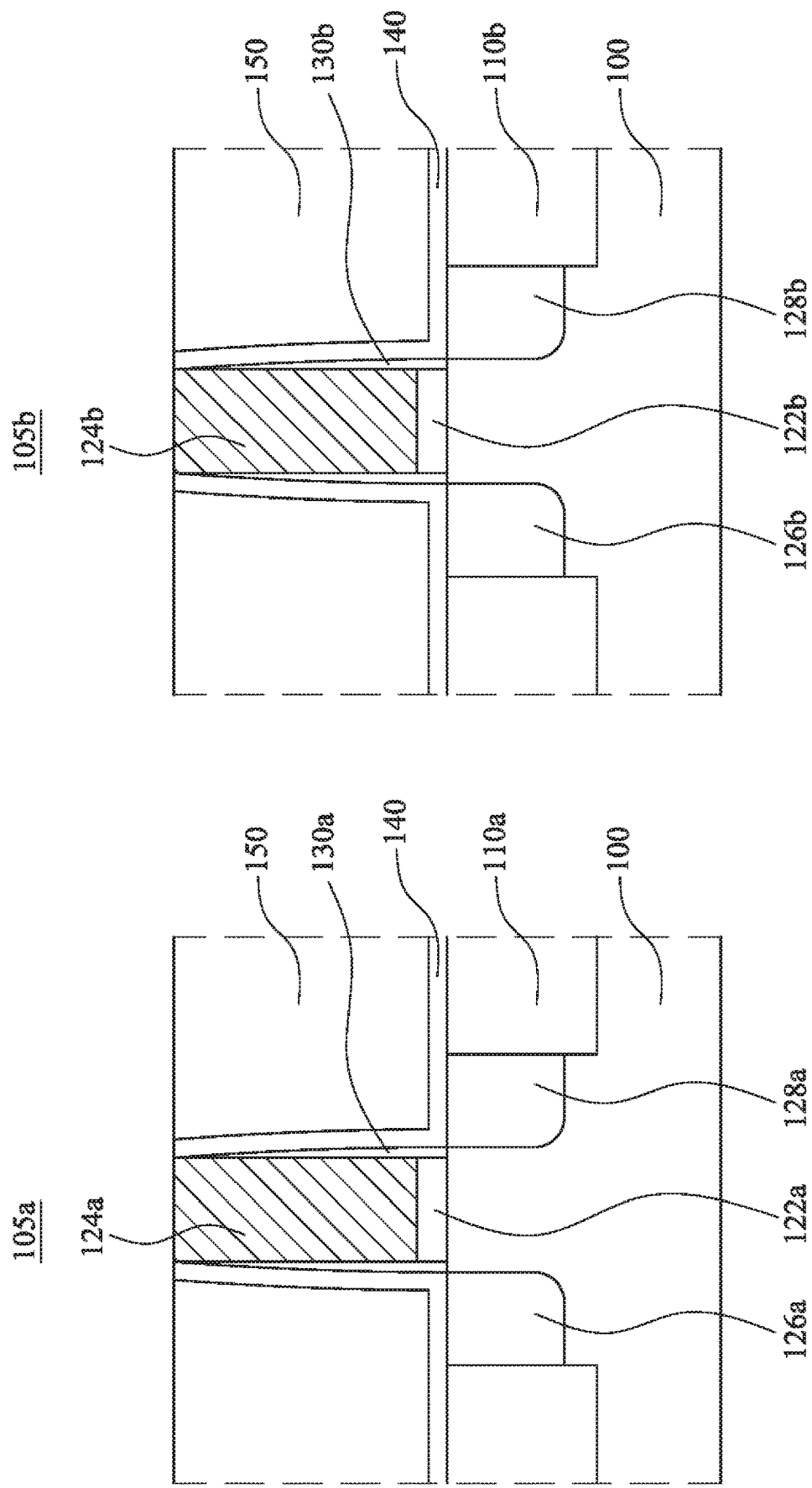

SEMICONDUCTOR DEVICE

CROSS-REFERENCE TO RELATED APPLICATIONS

The present application is a continuation of U.S. patent application Ser. No. 14/248,755, filed on Apr. 9, 2014, now U.S. Pat. No. 9,935,013, issued on Apr. 3, 2018, which are incorporated herein by reference in its entirety.

BACKGROUND

At present, integrated circuit (IC) chips must be able to allow a wide range of on-chip requirements across devices on the chip to increase circuit performance. However, satisfying the wide range of on-chip requirements across various devices needs to increase the design flexibility, and the process complexity is thus also increased.

For example, gate oxide thickness variation, poly gate length variation, and pocket implantation are usually used to modulate $I_{ddq}$ performance across various devices on a single IC chip. However, as the critical line width of the semiconductor process is continuously decreased, and the operation speed has to be continuously increased, the methods described above are trapped in a bottleneck.

For the method of varying the gate oxide thickness, the material of the gate oxide layer has been replaced by dielectric materials with high dielectric constants, and the thickness of the gate dielectric layer has been greatly decreased to balance the current leakage and the operation speed of a CMOS device. However, the thickness of the gate dielectric layer cannot be decreased anymore, since the thickness of the gate dielectric layer has reached a physical limit. For the method of varying poly gate length, since the variation range of the gate length is majorly limited by the design rule, and the modulation effect is thus limited. For the method of pocket implantation, the current leakage of a CMOS device can be decreased as the doping concentration of the pocket implantation is increased and the doping concentration of source/drain is decreased, but the operation speed of the devices is also sacrificed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1B-1D are cross-sectional diagrams of cutting lines B-B', C-C', and D-D' in FIG. 1A, respectively.

DETAILED DESCRIPTION

Figure 1A:
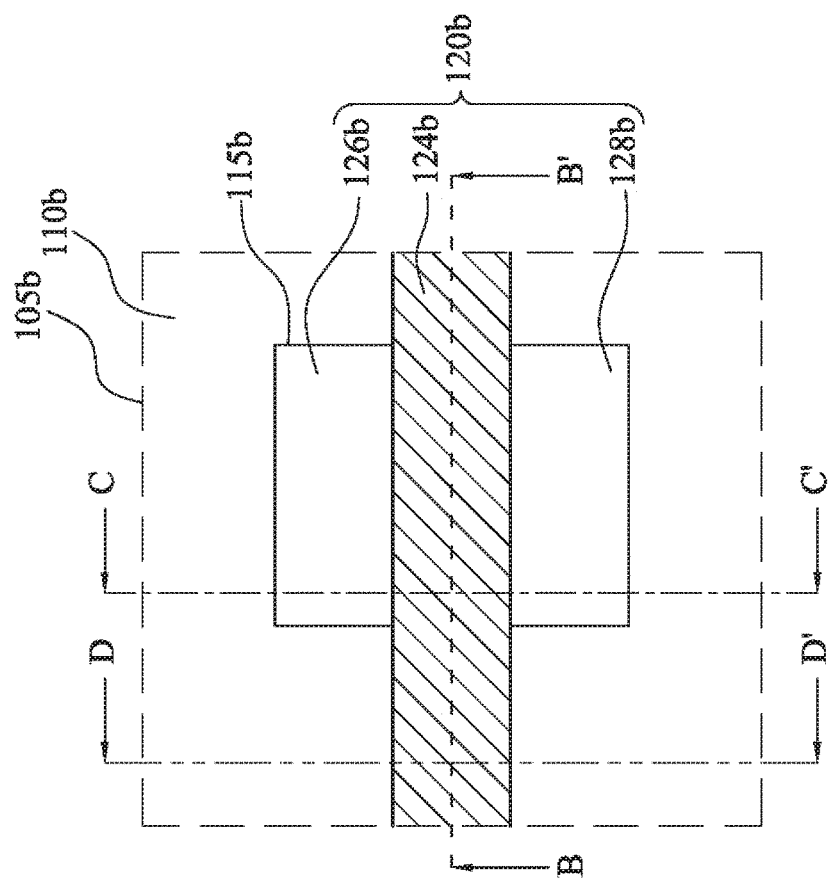
FIG. 1A is a top view diagram showing an integrated circuit structure according to some embodiments of this disclosure.
Figure 1A:
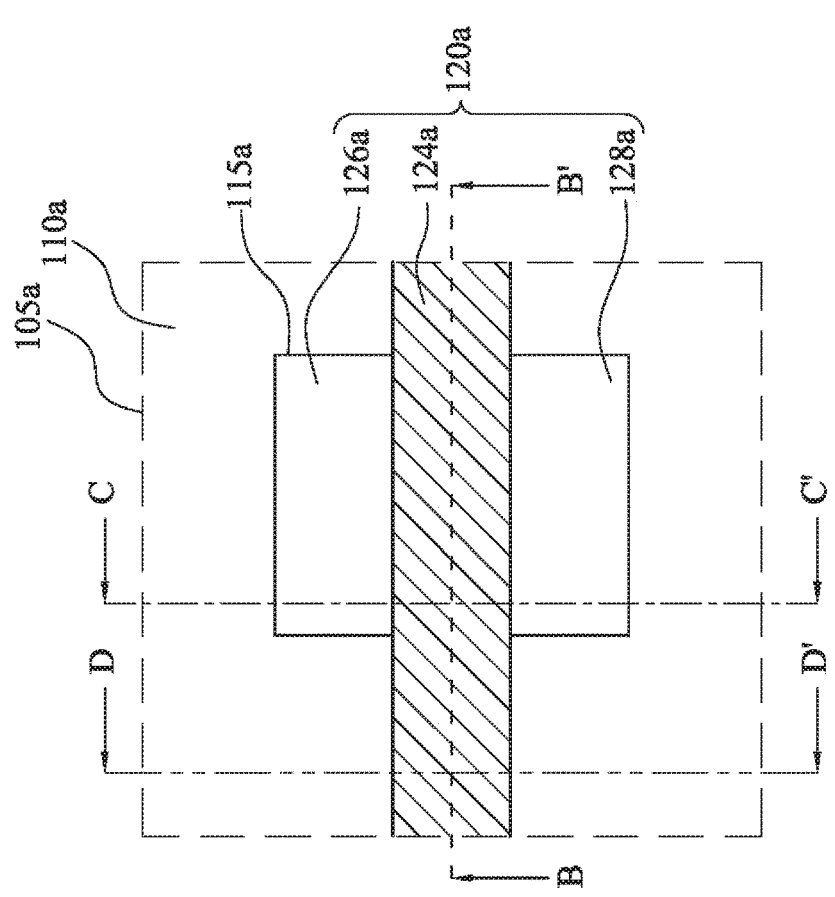

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Accordingly, a semiconductor device with an increased effective gate length or an increased effective channel width, but without increasing the occupied area of the semiconductor device, and a method of forming the same are provided in this disclosure. The effective gate length or an effective channel width of the device is increased by lowering a top surface of an oxide isolation structure below the gate of the semiconductor device.

Figure 1B:
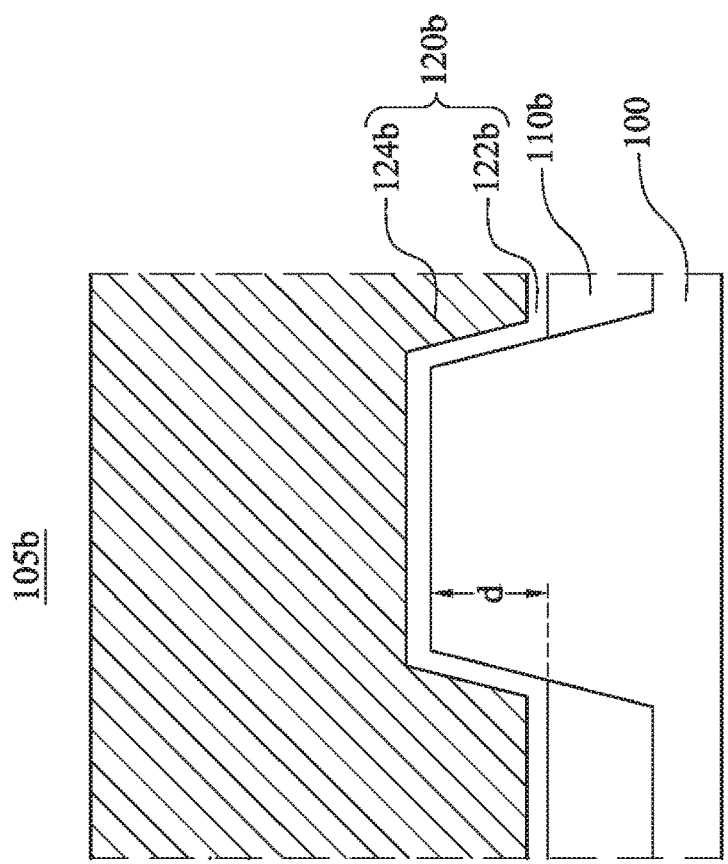
Figure 1B:
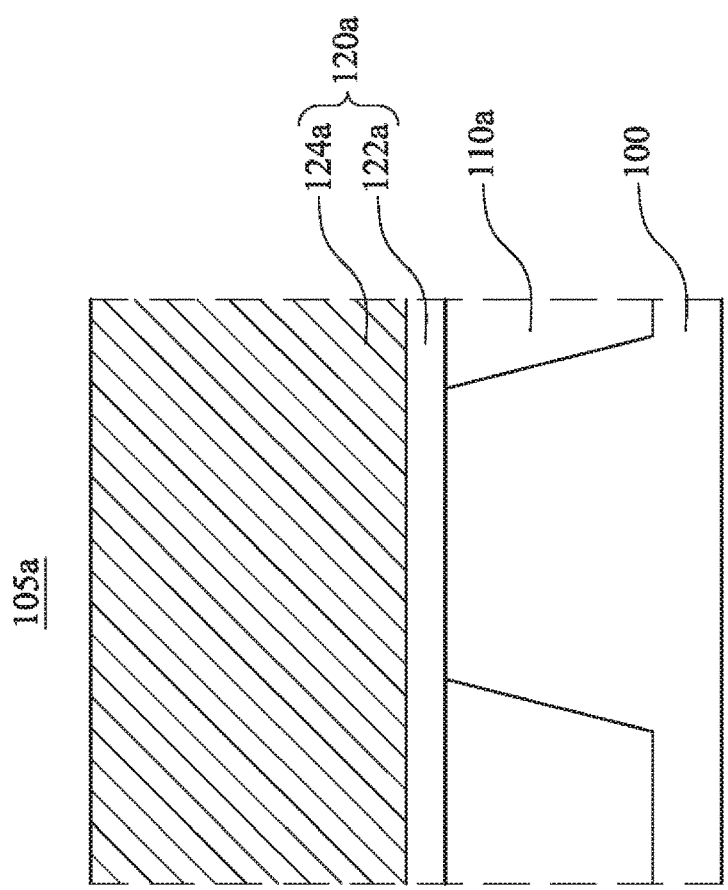
Figure 1D:
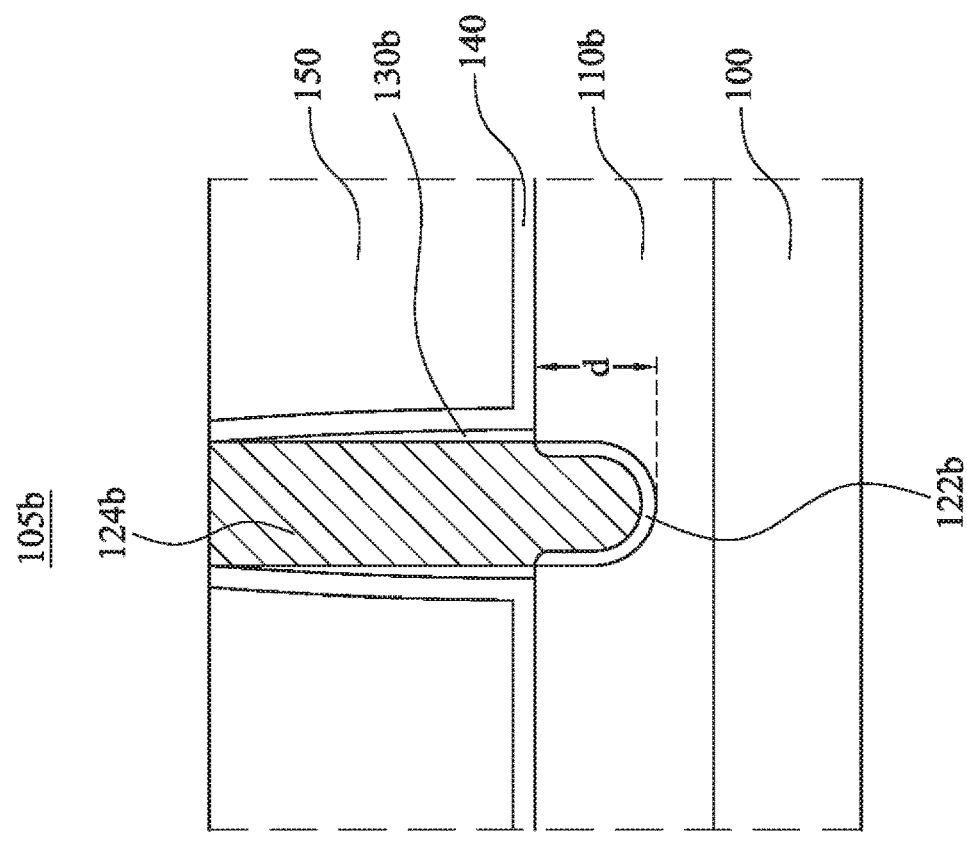
Figure 1D:
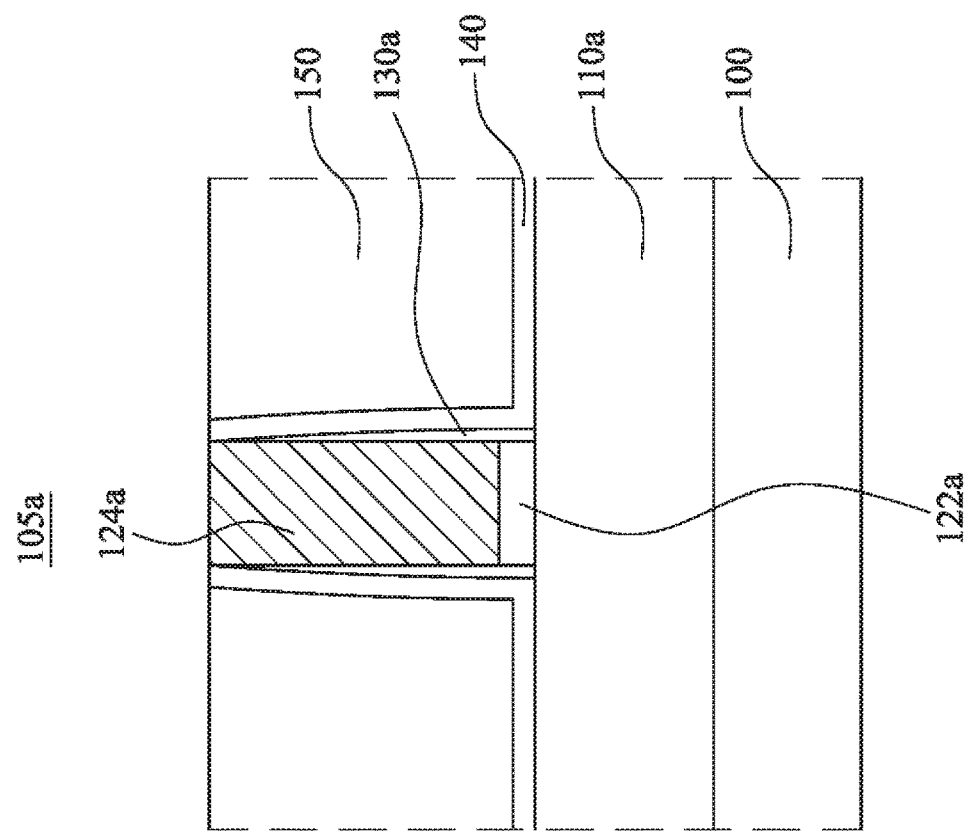

FIG. 1A is a top view diagram showing an integrated circuit structure according to some embodiments of this disclosure. FIGS. 1B-1D are cross-sectional diagrams of cutting lines B-B', C-C', and D-D' in FIG. 1A, respectively. Therefore, FIGS. 1A-1D are referred below at the same time.

In FIGS. 1A-1D, a substrate 100 has a first area 105a and a second area 105b. In some embodiments, the first area 105a and the second area 105b can be an input/output area and a logic area, for example.

In the first area 105a, a first active area 115a is surrounded or defined by a first oxide isolation structure 110a in the substrate 100. A first semiconductor device 120a is disposed on the first active area 115a. The first semiconductor device 120a includes a first gate dielectric layer 122a, a first gate 124a, a first source 126a, and a first drain 128a. In the first semiconductor device 120a, the first gate dielectric layer 122a and the first gate 124a are sequentially disposed on the substrate 100. In the first active area 115a, the first source 126a and the first drain 128a are respectively located on two sides of the first gate 124a.

In the second area 105b, a second active area 115b is surrounded or defined by a second oxide isolation structure 110b in the substrate 100. A second semiconductor device 120b is disposed on the second active area 115b. The second semiconductor device 120b includes a second gate dielectric layer 122b, a second gate 124b, a second source 126b, and a second drain 128b. In the second semiconductor device 120b, the second gate dielectric layer 122b and the second gate 124b are sequentially disposed on the substrate 100. In the second active area 115b, the second source 126b and the second drain 128b are respectively located on two sides of the second gate 124b.

In addition, the top surface of the second oxide isolation structure 110b is lowered to increase the effective gate length of the second gate 124b or increase the channel width of the channel between the second source 126b and the second drain 128b. Therefore, the top surface of the second oxide isolation structure 110b below the second gate 124b is lower than the top surfaces of the second oxide isolation structure 110b not below the second gate 124b, such as shown in FIG. 1D, and the second active area 115b, such as shown in FIG. 1B, by a depth d from about 6 nm to the depth of the second oxide isolation structure 110b. According to some embodiments, the depth d may be more than 8 nm. According to some other embodiments, the depth d may be more than 10 nm.

In some embodiments, the first oxide isolation structure 110a and the second oxide isolation structure 110b above may be shallow trench isolation structures or field oxide isolation structures, for example. In some other embodiments, the first semiconductor device 120a and the second semiconductor device 120b may be a metal-oxide-semiconductor filed effect transistor (MOSFET), for example.

In some other embodiments, the first gate dielectric layer 122a and the second gate dielectric layer 122b above may be made from a dielectric material having a dielectric constant more than the dielectric constant of silicon dioxide (i.e. a high-k dielectric material). The high-k dielectric material may be hafnium silicate, zirconium silicate, hafnium dioxide, zirconium dioxide, or any combinations thereof, for example. In some other embodiments, the first gate 124a and the second gate 124b above may be made from a metal, such as Al, W, Ta, TaN, TiN, or any combinations thereof, for example.

In addition, first spacers 130a and second spacers 130b may further respectively disposed on sidewalls of the first gate 124a and the second gate 124b. In some embodiments, the first spacers 130a and the second spacers 130b may be made from silicon oxide or silicon oxynitride, for example.

Furthermore, an etching stop layer 140 and a dielectric layer 150 may sequentially disposed on the substrate 100 to cover the first semiconductor device 120a, the second semiconductor device 120b, the first oxide isolation structure 110a, and the second oxide isolation structure 110b. In some embodiments, the etching stop layer 140 may be made from silicon oxynitride or silicon nitride, for example. In some other embodiments, the dielectric layer 150 may be made from a dielectric material having a dielectric constant smaller than the dielectric constant of silicon dioxide (i.e. a low-k dielectric material). Common low-k dielectric material includes fluorine-doped silicon dioxide, carbon-doped silicon dioxide, porous silicon dioxide, porous carbon-doped silicon dioxide, a spin-on organic polymeric dielectric (such as polyimide, polynorbornenes, benzocyclobutene, or polytetrafluoroethylene), a spin-on silicone based polymeric dielectric (such as hydrogen silsesquioxane (HSQ) and methylsilsesquioxane (MSQ)).

Figure 2:
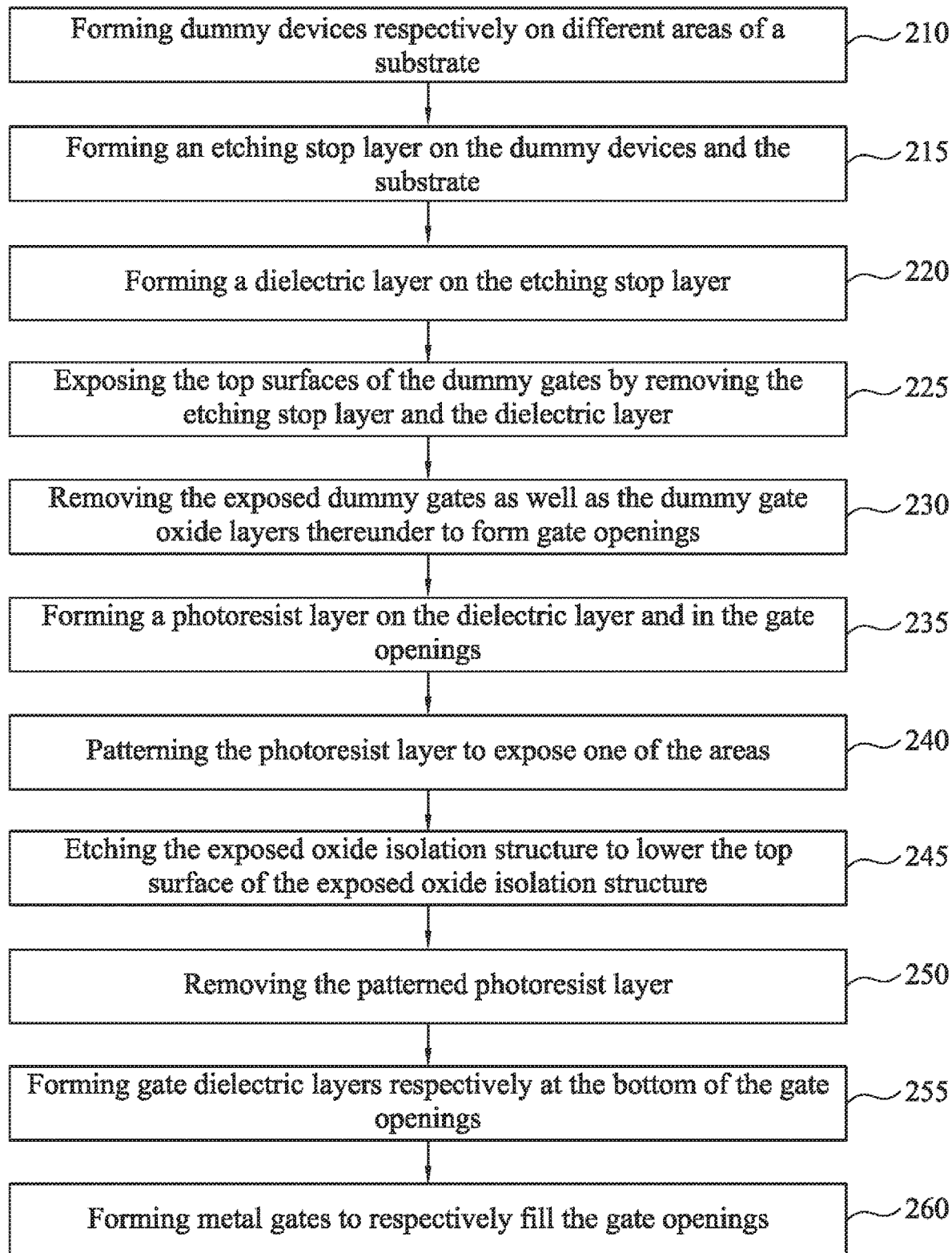
FIG. 2 is a flow chart of a process for adjusting effective gate length or effective channel width of a semiconductor device according to some embodiments of this disclosure.

Next, a method of adjusting effective gate length of a semiconductor device is discussed below. Accordingly, FIG. 2 is a flow chart of a process for adjusting effective gate length or effective channel width of a semiconductor device according to some embodiments of this disclosure. FIGS. 3A-3E are cross-sectional diagrams of cutting lines D-D' in FIG. 1A to illustrate a process for adjusting effective gate length or effective channel width of a semiconductor device according to some embodiments of this disclosure. FIGS. 2 and 3A-3E are referred below at the same time.

Figure 3A:
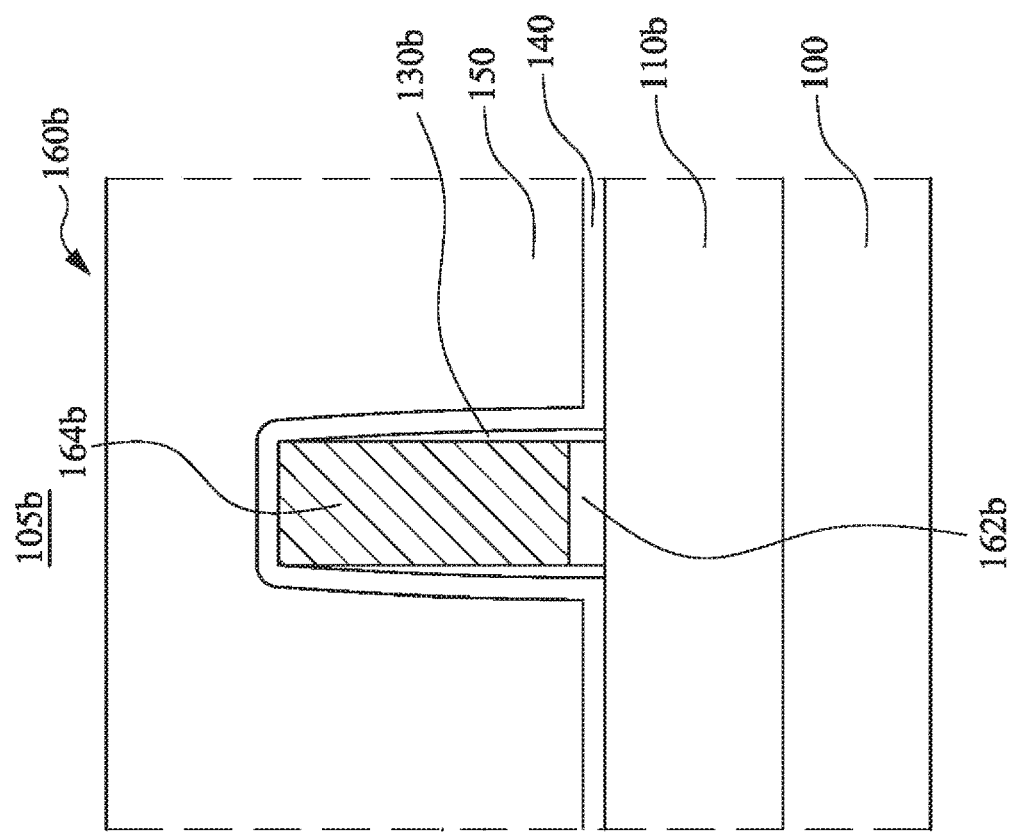
FIGS. 3A-3E are cross-sectional diagrams of cutting lines D-D' in FIG. 1A to illustrate a process for adjusting effective gate length or effective channel width of a semiconductor device according to some embodiments of this disclosure.
Figure 3A:
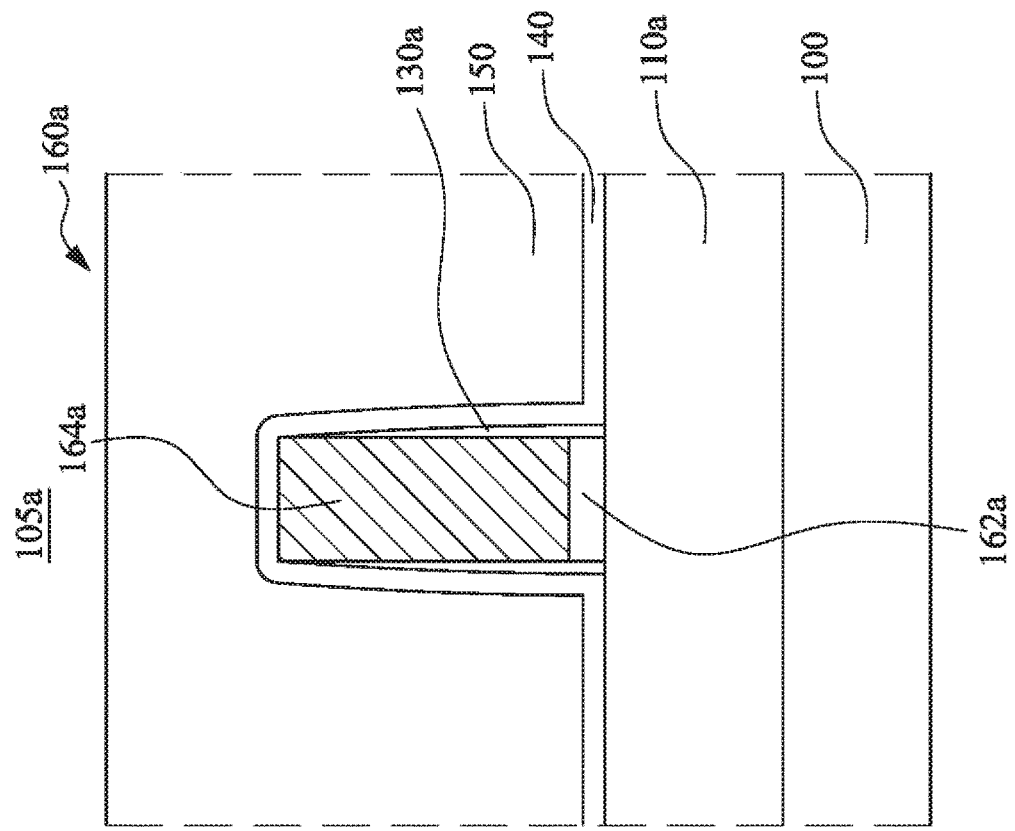

In step 210 of FIG. 2 and FIG. 3A, a first dummy semiconductor device 160a and a second dummy semiconductor device 160b are formed respectively in the first area 105a and the second area 105b on the substrate 100. The first dummy semiconductor device 160a includes a first dummy gate oxide layer 162a, a first dummy gate 164a, the first source 126a (see FIG. 1A) and the first drain 128a (see FIG. 1A). The second dummy semiconductor device 160b includes a second dummy gate oxide layer 162b, a second dummy gate 164b, the second source 126b (see FIG. 1A) and the second drain 128b (see FIG. 1A).

Next, the first spacers 130a and the second spacers 130b are respectively formed on the sidewalls of the first dummy gate 164a and the second dummy gate 164b. The first spacers 130a and the second spacers 130b may be formed by a process of depositing a dielectric layer followed by anisotropic etching the dielectric layer. The deposition method of the dielectric layer may be performed by a chemical vapor deposition. The anisotropic etching may be performed by plasma etching.

In step 215 of FIG. 2 and FIG. 3A, the etching stop layer 140 is formed on the substrate 100 to cover the first dummy semiconductor device 160a, the second dummy semiconductor device 160b, the first oxide isolation structure 110a and the second oxide isolation structure 110b. Then, in step 220 of FIG. 2 and FIG. 3A, the dielectric layer 150 is formed on the substrate 100 to cover the etching stop layer 140.

Figure 3B:
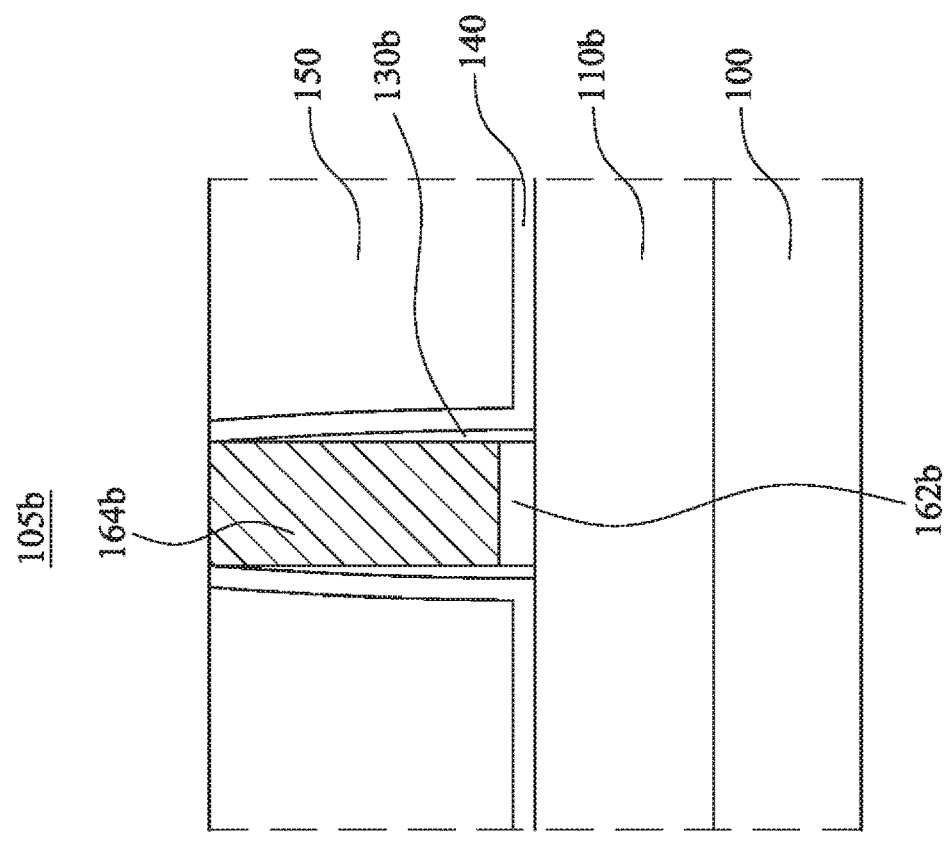
Figure 3B:
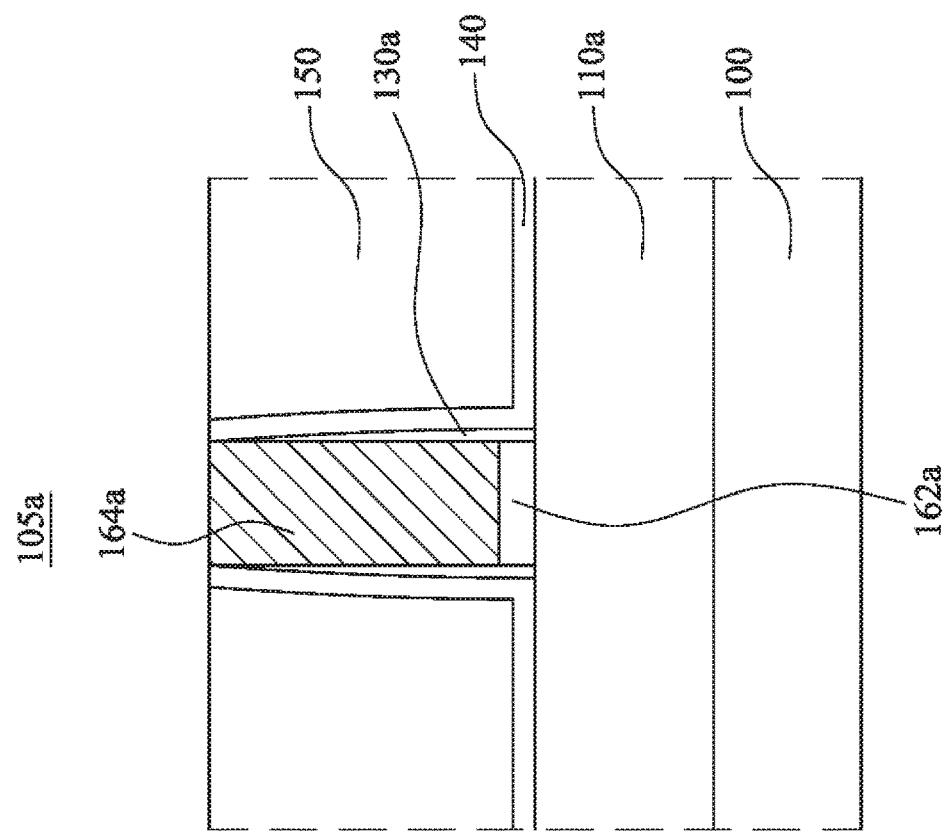

In step 225 of FIG. 2 and FIG. 3B, the top surfaces of the first dummy gate 164a and the second dummy gate 164b are exposed by removing the etching stop layer 140 and the dielectric layer 150 above the first dummy gate 164a and the second dummy gate 164b. The removal of the etching stop layer 140 and the dielectric layer 150 may be performed by blanket etching or chemical mechanical polishing.

Figure 3C:
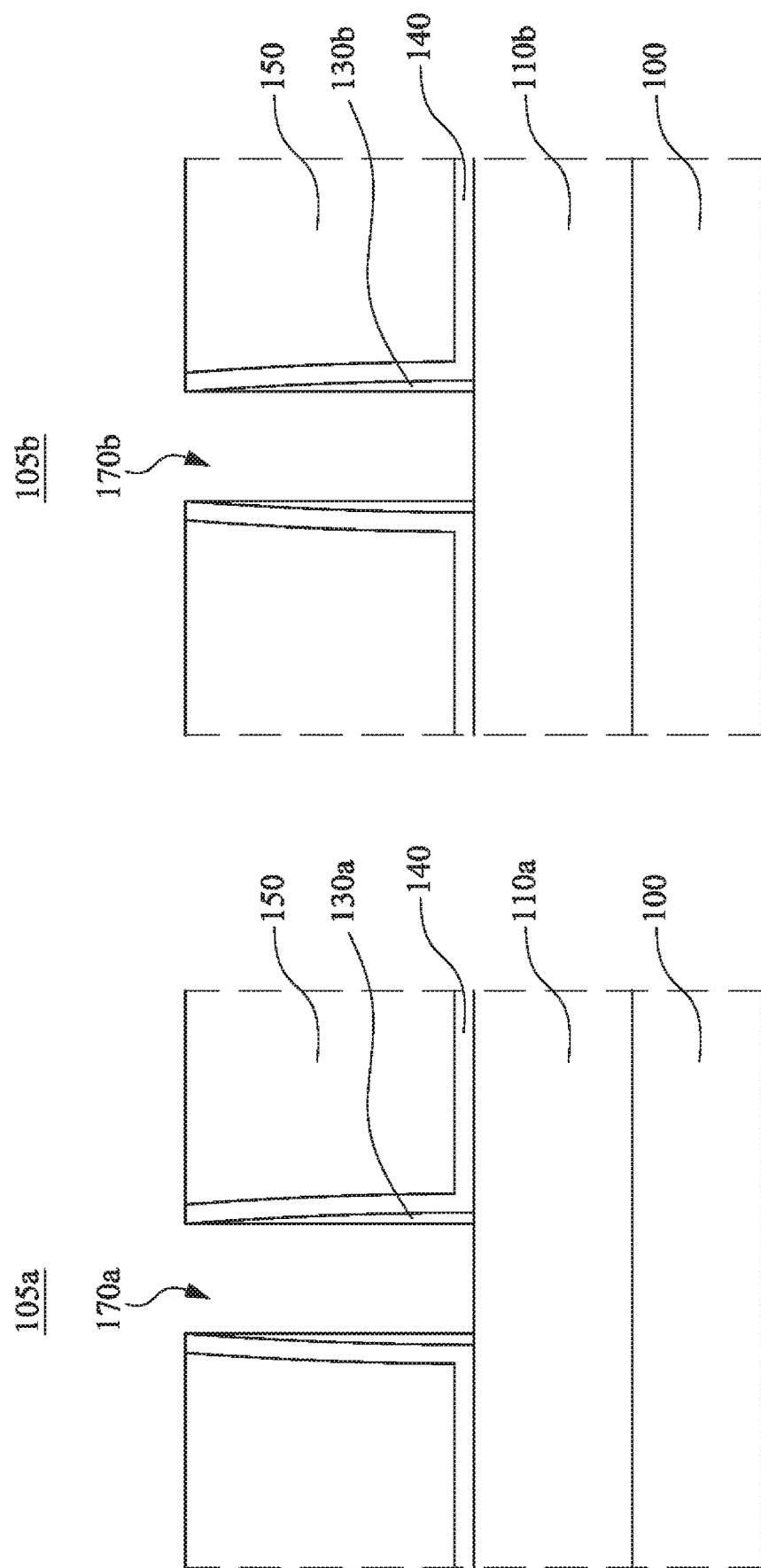

In step 230 of FIG. 2 and FIG. 3C, the first dummy gate 164a and the first dummy gate oxide layer 162a thereunder, as well as the second dummy gate 164b and the second dummy gate oxide layer 162b thereunder are removed to form the first gate opening 170a and the second gate opening 170b. The removing may be performed by any available etching process, such as dry etching or wet etching.

Figure 3D:
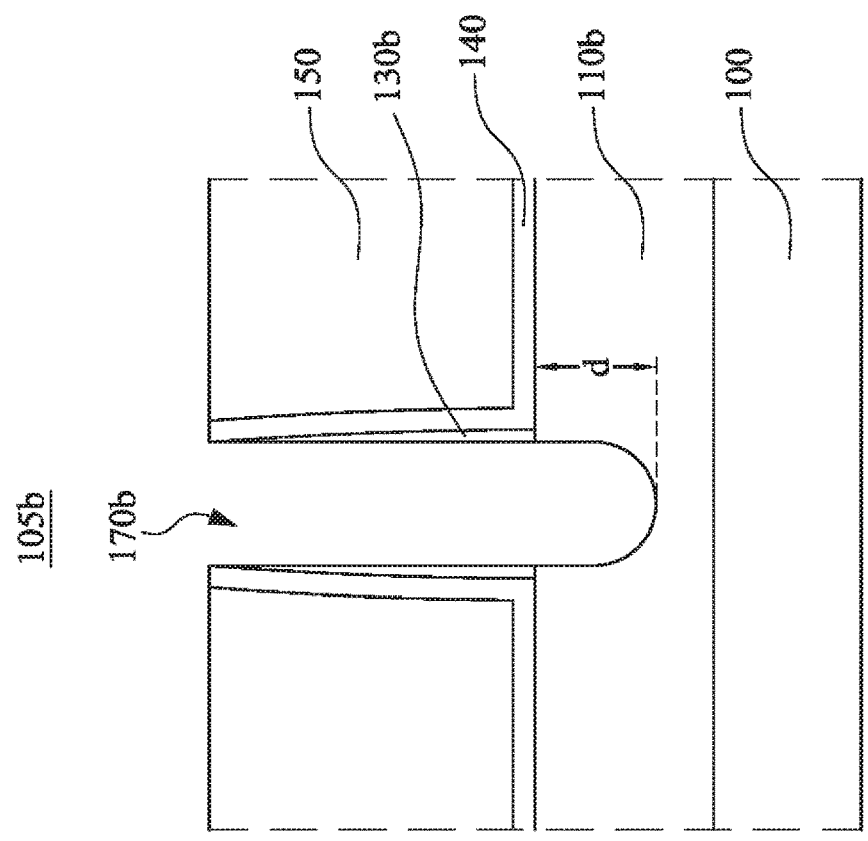
Figure 3D:
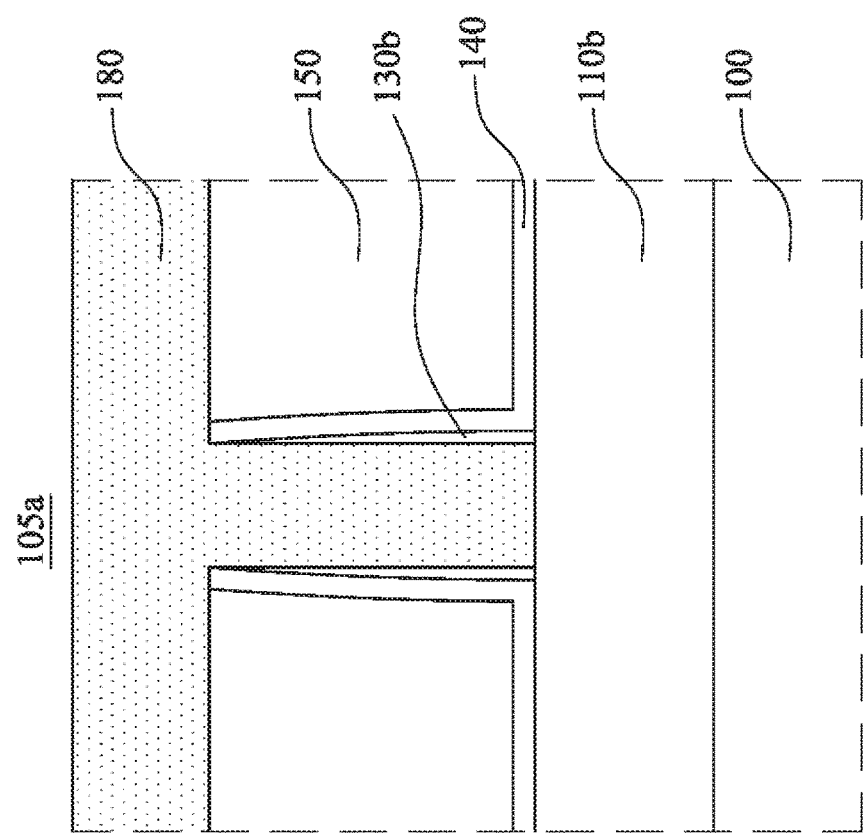

In step 235 of FIG. 2 and FIG. 3D, a photoresist layer 180 is formed on the substrate 100 to cover the first area 105a and the second area 105b, as well as to fill the first gate opening 170a and the second gate opening 170b. Then in step 240, the photoresist layer 180 is patterned to cover the first area 105a but expose the second area 105b, and the photoresist layer 180 in the second gate opening 170b is thus removed. The photoresist layer 180 may be patterned by a photolithography process including exposing through a photomask, developing by a developing solution to remove the photoresist not needed, and baking to remove the solvent of the photoresist to harden the photoresist.

In step 245 of FIG. 2 and FIG. 3D, the second oxide isolation structure 110a exposed by the second gate opening 170b is then etched to the depth d to lower the top surface of the second oxide isolation structure 110a exposed by the second gate opening 170b. Therefore, the etching depth d can be used to adjust the effective gate length or the effective channel width of the second semiconductor device 120b finally obtained. The deeper the etching depth d is, the longer the effective gate length is or the wider the effective channel width is. The etching may be performed by wet etching, for example.

In step 250 of FIG. 2, the patterned photoresist layer 180 is removed. The removing method of the patterned photoresist layer 180 may be ashing by oxygen plasma or stripping by a stripping solution.

Figure 3E:
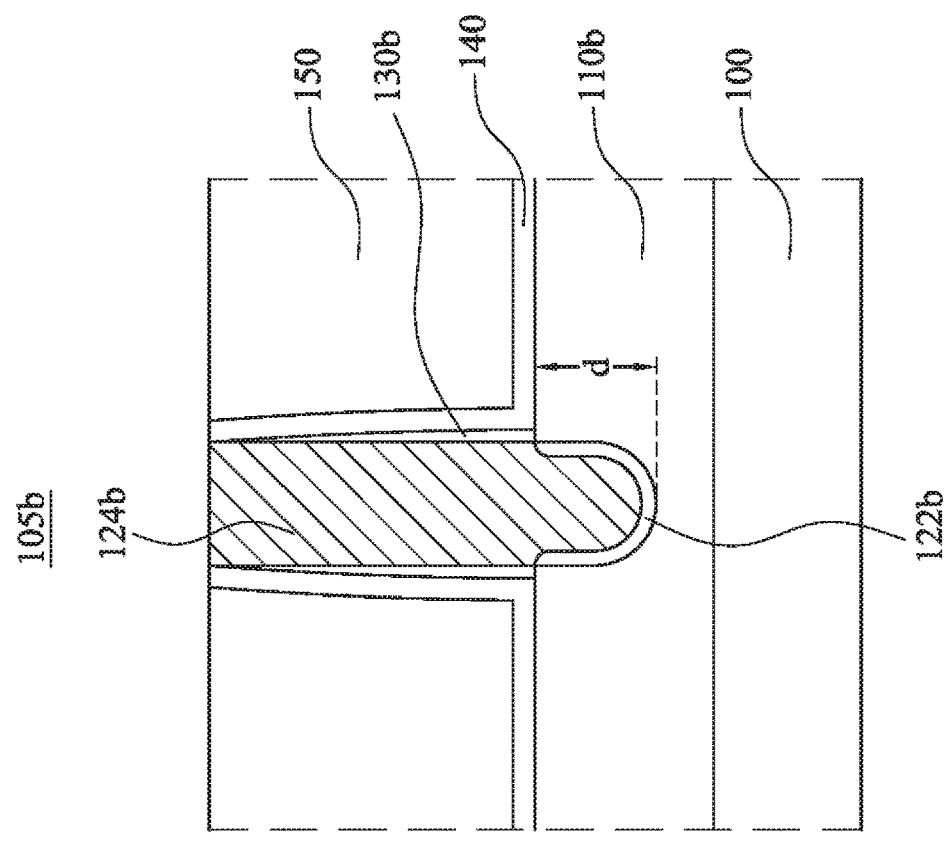
Figure 3E:
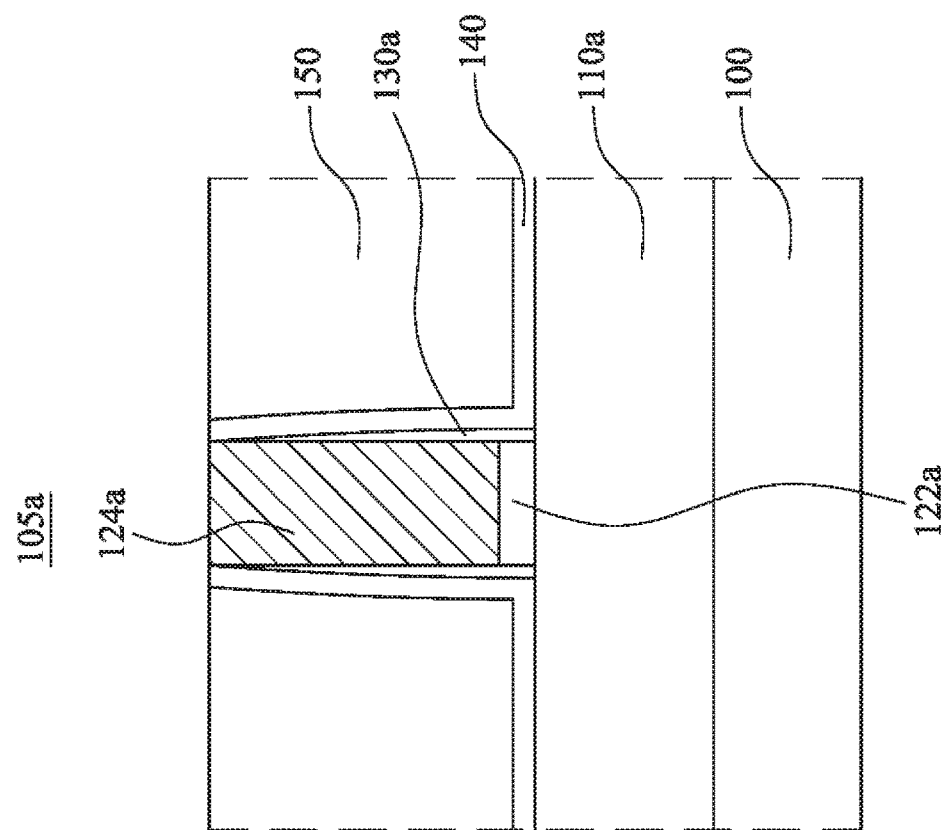

In FIG. 255 of FIG. 2 and FIG. 3E, the first gate dielectric layer 122a and the second gate dielectric layer 122b are formed respectively at the bottoms of the first gate opening 170a and the second gate opening 170b. The first gate dielectric layer 122a and the second gate dielectric layer 122b may be formed by metal organic chemical vapor deposition, or molecular beam epitaxial deposition.

In step 260 of FIG. 2 and FIG. 3E, the first gate 124a and the second gate 124b are formed respectively in the first gate opening 170a and the second gate opening 170b to fill the first gate opening 170a and the second gate opening 170b. The first gate 124a and the second gate 124b may be formed by physical vapor deposition, chemical vapor deposition, or atomic layer deposition.

Some comparison tests were performed for MOSFETs of a logic circuit in the core region of a chip. Comparing a first MOSFET obtained by a process containing no selective etch of the shallow trench isolation structure and a second MOSFET obtained by a process containing the selective etch of the shallow trench isolation structure, the top surface of the STI surrounding the second MOSFET is lowered by 6 nm. When the MOSFET is a NMOS as well as the first NMOS and the second NMOS have the same off current ($I_{off}$), the saturation drain current ($I_{dSat}$) under a constant gate voltage for the second N MOS is 5% more than the saturation drain current of the first NMOS. When the MOSFET is a PMOS as well as the first PMOS and the second PMOS have the same off current, the saturation drain current under a constant gate voltage for the second PMOS is 3% more than the saturation drain current of the first PMOS. Therefore, the on/off switch rate of the second NMOS and the second PMOS with increased gate length or increased channel width can be effectively increased to greatly improve the computing speed of the logic circuit in the core region of the chip.

Accordingly, a semiconductor device with an increased effective gate length is provided in this disclosure. The semiconductor device with an increased effective gate length comprises an active area on a substrate, an oxide isolation structure surrounding the active area, a gate across the active area and the oxide isolation structure, a gate dielectric layer disposed between the gate and the substrate, as well as a source and a drain respectively located in the exposed active area on two sides of the gate. The oxide isolation structure below the gate has a top surface lower than a top surface of the active area to increase the effective gate length.

An integrated circuit (IC) structure having devices with various effective channel widths is also provided in this disclosure. The IC structure comprises a first active area and a second active area on a substrate, a first oxide isolation structure and a second isolation structure in the substrate, a first gate across the first active area, a second gate across the second active area, a first gate dielectric layer disposed between the first gate and the substrate, a second gate dielectric layer disposed between the second gate and the substrate, a first source and a first drain respectively located in the exposed first active area on two sides of the first gate, and a second source and a second drain respectively located in the exposed second active area on two sides of the second gate. The first and the second oxide isolation structures respectively surround the first and the second active areas. The second oxide isolation structure below the second gate has a top surface lower than a top surface of the second active area.

A method of adjusting effective gate length of a semiconductor device is also provided in this disclosure. In this method, a first dummy semiconductor device and a second dummy semiconductor device are formed respectively on a first area and a second area of a substrate. An etching stop layer and a dielectric layer are sequentially formed on the first and the second semiconductor devices and the substrate. Top surfaces of a first dummy gate of the first dummy semiconductor device and a second dummy gate of the second dummy semiconductor device are exposed by removing the etching stop layer and the dielectric layer above the first dummy gate and the second dummy gate. The first dummy gate and the second dummy gate, as well as a first dummy gate oxide layer under the first dummy gate and a second dummy gate oxide layer under the second dummy gate are removed to form a first gate opening and a second gate opening. A top surface of an oxide isolation structure exposed by the second gate opening is lowered by selectively etching the oxide isolation structure exposed by the second gate opening. A first and a second gate dielectric layers are formed respectively in the first and the second gate openings. A first and a second metal gates are formed respectively on the first and the second gate dielectric layers, whereby the second gate has a longer effective gate length than the first gate has.

Therefore, the area occupied by semiconductor devices on various areas of a chip may be remained unchanged, but the effective gate length or the effective channel width can be effectively increased by selectively etching oxide isolation structures under some gates in some areas. Moreover, the increased effective gate length or the increased effective channel width can be adjusted by the etching depth d in FIG. 3D of the selectively etch. Hence, semiconductor devices with various effective gate lengths or various effective channel widths can be easily formed and integrated in one chip. Accordingly, tunable device modulation may be achieved by selectively etching oxide isolation structures, and flexible $I_{on}/I_{off}$ boost of various kinds of circuits also can be achieved to offer optimum $I_{ddq}$ and fast operation speed.

In some embodiments, a semiconductor device includes a substrate, an isolation structure, and a gate structure. The substrate has an active area. The isolation structure surrounds the active area of the substrate. The gate structure is across the active area of the substrate. The isolation structure has a first portion under the gate structure and a second portion adjacent to the gate structure. A top surface of the first portion of the isolation structure is lower than a top surface of the second portion of the isolation structure.

In some embodiments, the gate structure has a rounded bottom portion.

In some embodiments, the gate structure includes a metal gate, and the metal gate has a bottom portion lower than the top surface of the second portion of the isolation structure.

In some embodiments, the semiconductor device further includes a spacer on a sidewall of the gate structure and in contact with the top surface of the second portion of the isolation structure.

In some embodiments, the top surface of the first portion of the isolation structure is a concave surface.

In some embodiments, the gate structure has a bottom portion in contact with the top surface of the first portion of the isolation structure.

In some embodiments, the gate structure is disposed over a sidewall of the active area of the substrate.

In some embodiments, the semiconductor device further includes a spacer on a sidewall of the gate structure. The gate structure has a bottom portion protruding over a bottom surface of the spacer into the isolation structure.

In some embodiments, the semiconductor device further includes an etch stop layer surrounding the gate structure.

The gate structure has a bottom portion lower than a bottom surface of the etch stop layer.

In some embodiments, a semiconductor device includes a substrate, an isolation structure, a first gate structure, and a second gate structure. The substrate has first and second active areas. The isolation structure surrounds the first and second active areas of the substrate. The first gate structure is across the first active area of the substrate and has a first interface with the isolation structure. The second gate structure is across the second active area of the substrate and has a second interface with the isolation structure. The bottom of the first interface is lower than the second interface.

In some embodiments, the bottom of the first interface is substantially rounded.

In some embodiments, the second interface is substantially flat.

In some embodiments, the bottom of the first interface is lower than a top of the isolation structure.

In some embodiments, the second interface is substantially coplanar with a top of the isolation structure.

In some embodiments, a semiconductor device includes a substrate, an isolation structure, a gate structure, and a spacer. The substrate has an active area. The isolation structure surrounds the active area of the substrate. The gate structure is across the active area of the substrate and has a first interface with the isolation structure. The spacer is disposed on a sidewall of the gate structure and has a second interface with the isolation structure. A bottom of the first interface is lower than the second interface.

In some embodiments, the semiconductor device further includes an etch stop layer surrounding the gate structure. The bottom of the first interface is lower than a bottom surface of the etch stop layer.

In some embodiments, the etch stop layer is over the isolation structure.

In some embodiments, the isolation structure includes a recess-defining wall that defines a recess, and the gate structure has a bottom portion received in the recess.

In some embodiments, the recess-defining wall has a rounded bottom surface.

In some embodiments, the recess-defining wall has opposite sidewalls.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A semiconductor device comprising:
a substrate having an active area;
an isolation structure surrounding the active area of the substrate;
a gate structure across the active area of the substrate, wherein the isolation structure has a first portion under the gate structure and a second portion adjacent to the gate structure, the first portion of the isolation structure has a top surface in contact with the gate structure, and the top surface of the first portion of the isolation structure is lower than a top surface of the second portion of the isolation structure; and
a spacer on a sidewall of the gate structure, wherein the gate structure has a bottom portion protruding over a bottom surface of the spacer into the isolation structure.

2. The semiconductor device of claim 1, wherein the gate structure has a rounded bottom portion.

3. The semiconductor device of claim 1, wherein the gate structure comprises a metal gate, and the metal gate has a bottom portion lower than the top surface of the second portion of the isolation structure.

4. The semiconductor device of claim 1, wherein the spacer on the sidewall of the gate structure is in contact with the top surface of the second portion of the isolation structure.

5. The semiconductor device of claim 1, wherein the top surface of the first portion of the isolation structure is a concave surface.

6. The semiconductor device of claim 1, further comprising:
an etch stop layer surrounding the gate structure, wherein the gate structure has a bottom portion lower than a bottom surface of the etch stop layer.

7. A semiconductor device comprising:
a substrate having first and second active areas;
an isolation structure surrounding the first and second active areas of the substrate;
a first gate structure across the first active area of the substrate and having a first interface with the isolation structure;
a second gate structure across the second active area of the substrate and having a second interface with the isolation structure, wherein a bottom of the first interface is lower than the second interface; and
an etch stop layer surrounding the first gate structure, wherein the first gate structure has a bottom portion lower than a bottom surface of the etch stop layer.

8. The semiconductor device of the claim 7, wherein the bottom of the first interface is lower than a top of the isolation structure.

9. A semiconductor device comprising:
a substrate having an active area;
an isolation structure surrounding the active area of the substrate;
a gate structure across the active area of the substrate and having a first interface with the isolation structure; and
a spacer on a sidewall of the gate structure and having a second interface with the isolation structure, wherein a bottom of the first interface is lower than the second interface, the gate structure has a third interface with the active area, and the third interface is substantially coplanar with the second interface.

10. The semiconductor device of claim 9, further comprising:
an etch stop layer surrounding the gate structure, wherein the bottom of the first interface is lower than a bottom surface of the etch stop layer.

11. The semiconductor device of claim 10, wherein the etch stop layer is over the isolation structure.

12. The semiconductor device of claim 9, wherein the isolation structure comprises a recess-defining wall that defines a recess, and the gate structure has a bottom portion received in the recess.

13. The semiconductor device of claim 12, wherein the recess-defining wall has a rounded bottom surface.

14. The semiconductor device of claim 12, wherein the recess-defining wall has opposite sidewalls.

15. The semiconductor device of claim 1, wherein a top surface of the active area under the gate structure is higher than the top surface of the first portion of the isolation structure.

16. The semiconductor device of claim 7, wherein the second gate structure has a third interface with the second active area and the bottom of the first interface is lower than the third interface.

17. The semiconductor device of claim 7, wherein the first gate structure includes a gate dielectric layer that has a U-shaped cross-section.

18. The semiconductor device of claim 7, further comprising a spacer on a sidewall of the second gate structure and having a bottom above a bottom of the second gate structure.

19. The semiconductor device of claim 7, further comprising a spacer on a sidewall of the second gate structure, wherein the second gate structure includes a gate dielectric layer and a bottom of the spacer is above a top of the gate dielectric layer.

20. The semiconductor device of claim 1, wherein the gate structure is disposed over a sidewall of the active area of the substrate.

* * * * *